United States Patent [19]

Ottos

[11] 4,020,416
[45] Apr. 26, 1977

[54] METHOD OF DETECTING HEATER RESISTANCE INDEPENDENT OF CONTACT RESISTANCE

[75] Inventor: James Gunard Ottos, Lancaster, Pa.
[73] Assignee: RCA Corporation, New York, N.Y.
[22] Filed: May 20, 1976
[21] Appl. No.: 688,475
[52] U.S. Cl. .................................. 324/64; 324/62; 361/154
[51] Int. Cl.² ........................................ G01R 27/14
[58] Field of Search ............. 324/64, 62; 317/141 S
[56] References Cited
UNITED STATES PATENTS

| | | | |
|---|---|---|---|
| 2,899,141 | 8/1959 | Harmon et al. ................... | 324/64 X |
| 3,212,001 | 10/1965 | Marshall .............................. | 324/62 |
| 3,464,007 | 8/1969 | Williams .............................. | 324/64 |

*Primary Examiner*—Stanley T. Krawczewicz
*Attorney, Agent, or Firm*—Glenn H. Bruestle; William H. Murray

[57] ABSTRACT

A constant current is applied through a heater by means of an electrical connector which mates with terminal pins of the tube. The applied current causes a voltage across the heater. A first voltage measurement is made across the heater at a first time. After a predetermined time interval has elapsed, a second voltage measurement is made across the heater. The value of the first voltage measurement is substracted from the value of the second voltage measurement and the value of the difference obtained is compared with a predetermined reference value. If the difference value is less than the reference value, a first nominal value of heater resistance is indicated. If the difference value is greater than the reference value, a second nominal value is indicated. The nominal heater resistance values are detected independent of the electrical connector contact resistance.

6 Claims, 6 Drawing Figures

METHOD OF DETECTING HEATER RESISTANCE INDEPENDENT OF CONTACT RESISTANCE

BACKGROUND OF THE INVENTION

This invention relates to a method of detecting heater resistance in electron tubes and particularly to a method of detecting heater resistance in cathode ray tubes in the presence of relatively high contact resistances.

A vacuum bake is normally included as one of the processing steps for cathode ray tubes having oxide coated cathodes. The oxide coated cathodes are usually activated during the vacuum bake by applying a constant current to the cathode heaters associated therewith for a predetermined length of time. In a production run of cathode ray tubes where heater types vary from tube to tube, it is imperative that the amount of activating current applied be selected according to the nominal value of heater resistance of the tube being processed. Otherwise, a tube requiring a higher-than-applied current would not be adequately activated and a tube requiring a lower-than-applied current would be damaged.

One method of determining heater type which has been used in the past requires an operator to identify visual markings on the tube and thereafter apply the proper activation current. The principal drawback of this method is that inattentative operators could apply the wrong activation current thereby ruining the tube.

Another method comprises measuring the heater resistance in order to identify the heater type. The problem with this method is that connector contact resistances can vary so much because of the high temperature environment, that one cannot reliably distinguish between heaters of different nominal resistances.

SUMMARY OF THE INVENTION

A method of detecting a nominal resistance value of a heater element in an electron tube independent of measurement connection contact resistance wherein the heater element has a resistance value which is equal to one of at least two nominal values. The method comprises the steps of applying, at a first time, a first level of constant current through the heater. Then, at a second time, measuring a first voltage across the heater, the second time following the first time by a predetermined interval. Next, measuring, at a third time, a second voltage across the heater and determining the difference between the first and second voltage measurements, the third time following the second time by a predetermined interval. Finally, comparing the value of the difference between the first and second voltage measurements with a predetermined reference value.

DETAILED DESCRIPTION

Figure 1:
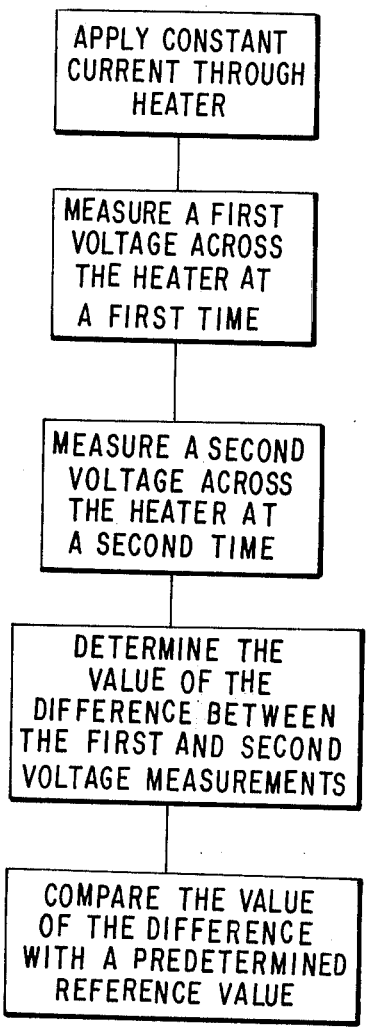
FIG. 1 is a flow diagram depicting the steps of the method of the present invention.

The method of the present invention, as shown in the block diagram of FIG. 1, is preferably used to detect either one of two different heater types, each having a different nominal resistance value, which may be incorporated in a color television picture tube. One heater type is referred to as a quick heat type which has a cold resistance of approximately 1.6 ohms and a current rating of 725 milliamps (also referred to herein as quick heat current). The other heater type is referred to as a 'standard' type having a cold resistance of approximately 1.0 ohms and a current rating of 900 milliamps (also referred to herein as standard current).

Figure 2:
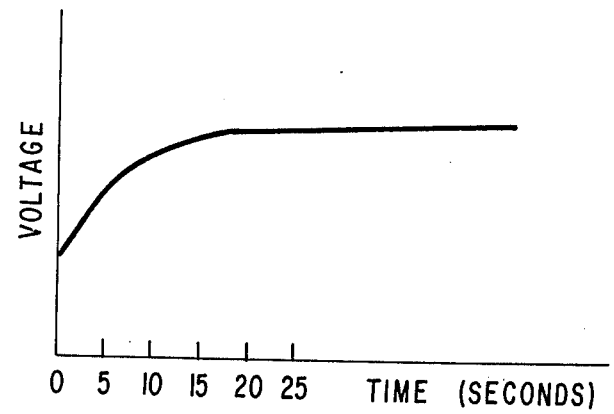
FIG. 2 is a plot of heater voltage versus time for a tube having a "quick heat" heater.
Figure 3:
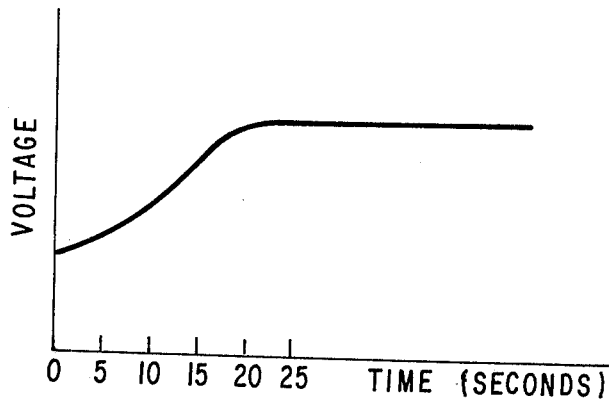
FIG. 3 is a plot of heater voltage versus time for a tube having a standard heater.

FIG. 2 depicts the characteristic voltage waveform of a quick heat type heater and FIG. 3 depicts the characteristic voltage waveform of a standard type heater. Referring to these figures it can be seen that between $t = 0.5$ second and $t =$ approximately 10 seconds, the slope of the quick heat waveform is greater than the slope of the standard waveform, upon application of quick heat current to both. It has been empirically determined that if the difference between two voltages measured at an interval of 2.5 seconds during the period $t = 0.5$ to $t = 6.0$ seconds is greater than 2.3 volts, this is indicative of a quick heat type heater. Similarly, if the voltage difference is less than 2.3 volts, this is indicative of a standard type. Using this empirical data, a voltage measurement is made at $t = 0.5$ second and a second voltage measurement is made at 2.5 seconds and the difference in the first and second voltage measurements is compared to a reference voltage of 2.3 volts to detect a quick heat or a standard type heater.

Figure 4:
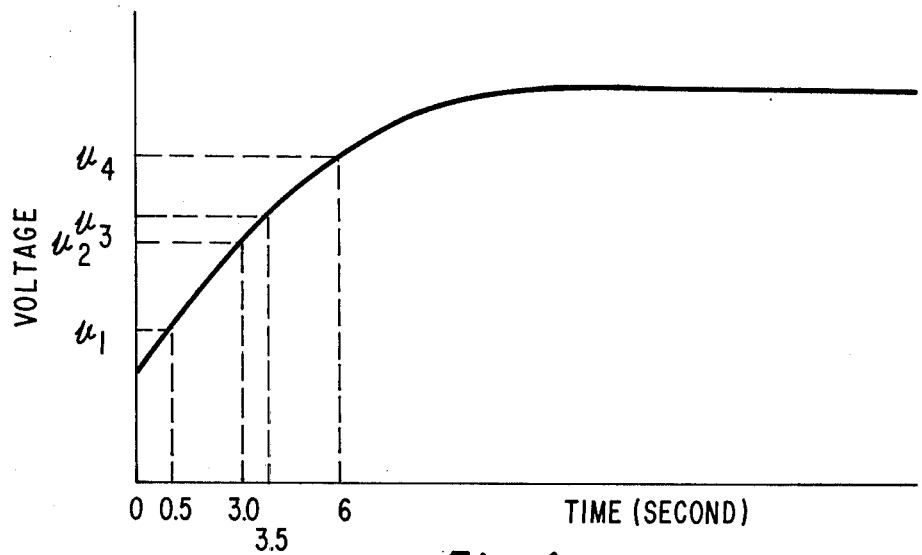
FIG. 4 is a plot of heater voltage versus time showing the times at which four measurements are made.

To enhance the reliability of the method of the present invention, the preferred embodiment of the equipment used to carry out the steps of the method of the present invention performs the basic method twice in the interval $t = 0.5$ to $t = 6.0$ seconds as follows. As shown in FIG. 4, at approximately 0.5 seconds after the application of the quick heat current, a first voltage measurement ($v_1$) is made. Approximately 2.5 seconds later, a second voltage measurement ($v_2$) is made. The difference between the first and second voltage measurements ($v_2-v_1$) is then determined and compared to a predetermined reference voltage, which is 2.3 volts in the present example. If the difference voltage is less than 2.3 volts, a first relay is energized. Approximately 0.5 seconds after the second voltage measurement ($v_2$), a third voltage measurement ($v_3$) is made. Approximately 2.5 seconds later, a fourth voltage measurement ($v_4$) is made and the difference between the third and fourth voltages ($v_4-v_3$) is determined. This difference voltage is compared against a reference voltage of 2.3 volts. If the difference voltage is less than the reference voltage, a second relay is energized. If the first and second relays are both energized (the equivalent of a logical "and" circuit), the higher standard heater current is applied to the heater. If either one of the first and second relays is not energized or if both are not energized, the heater current remains at the lower quick heat value.

Figure 5:
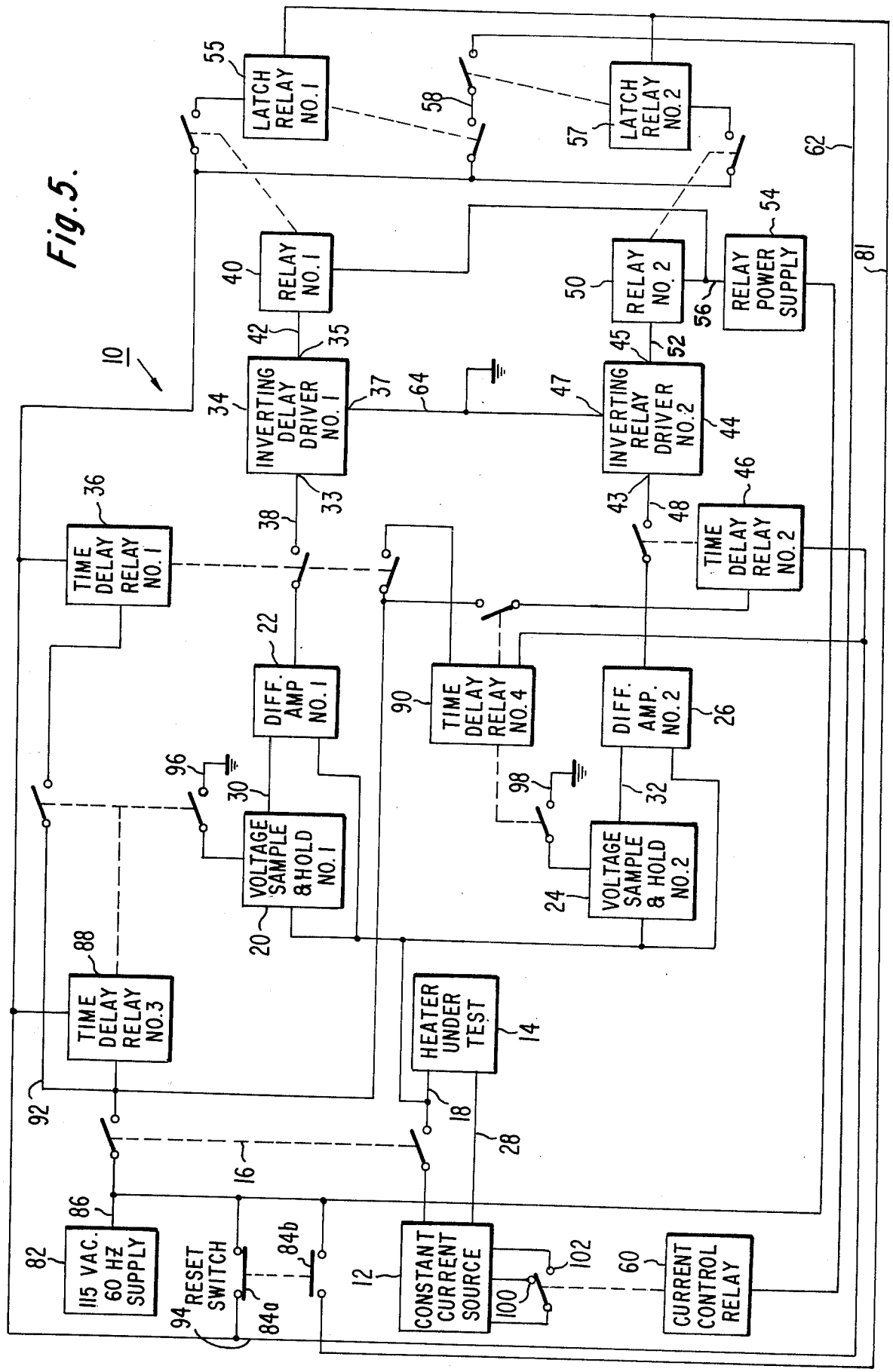
FIG. 5 is a schematic block diagram of equipment used to perform the method of the present invention.

FIG. 5 is a schematic block diagram of the equipment used to perform the method of the present invention. The equipment will be referred to as a quick heat filament detector" and is generally designated as 10 in FIG. 5. The quick heat filament detector 10 comprises a programmable constant current source 12 having two output terminals, one of which is connected to one terminal of a two terminal heater under test 14 through one pole of a double pole start switch 16 by means of one branch of a branching conductive path 18. The one output terminal of the constant current source is also electrically connected to an input of a first voltage sample and hold means 20, a non-inverting input of a first differential amplifier 22, an input of a second voltage sample and hold means 24, and a non-inverting input of a second differential amplifier 26 through the branching conductive path 18. The other terminal of the heater 14 is electrically connected to the other output terminal of the constant current source through a conductive path 28. Each sample and hold means is, for example, a Burr-Brown No. 3043/25 device having a control terminal which, when grounded, causes the device to acquire and hold the voltage present at the input terminal at the time of grounding.

An output of the first sample and hold means 20 is connected to an inverting input of the first differential amplifier 22 through a conductive path 30. An output of the second sample and hold 24 is connected to an inverting input of the second differential amplifier 26 through a conductive path 32. Each differential amplifier is, for example, a Fairchild No. 747DC "Dual In-line Operational Amplifier." An output of the first differential amplifier 22 is connected to a control terminal 33 of a first inverting relay driver 34 through one pole of a first double pole time delay relay 36 by a conductive path 38. An input terminal 35 of the first inverting relay driver 34 is connected to one side of a coil of a first relay 40, having a single pole switch, through a conductive path 42.

An output of the second differential amplifier 26 is connected to a control terminal 43 of a second inverting relay driver 44 through one pole of a second double pole time delay relay 46 by means of a conductive path 48. An input terminal 45 of the second inverting relay driver 44 is electrically connected to one side of a coil of a second relay 50, having a single pole switch, through a conductive path 52. An output of a relay power supply 54 is connected to the other side of the coil of the first relay 40 and the second relay 50, by a branching conductive path 56. A first side of a normally closed contact 84(a) of a two pole reset switch 84 is connected to the latch coils of a first latching relay 55 and a second latching relay 57 through the single pole switches of the first and second relays, 40 and 50 respectively by a branching conductive path 94.

The first latching relay 55 has a single pole switch, one terminal of which is electrically connected to the first side of the normally closed contact 84(a) through one branch of the branching conductive path 94. The second latching relay 57 has a single pole switch, one terminal of which is electrically connected to the other terminal of the first latching relay switch through a conductive path 58. The other terminal of the second latching relay switch is electrically connected to a current control relay 60 through a conductive path 62. The first and second latching relays 55 and 57 are, for example, Allen Bradley Catalog No. 700-NM200-A1 relays. The first 40 and second 50 relays are, for example, Potter Brumfield Catalog No. KCP-11-D-10000 relays.

Figure 6:
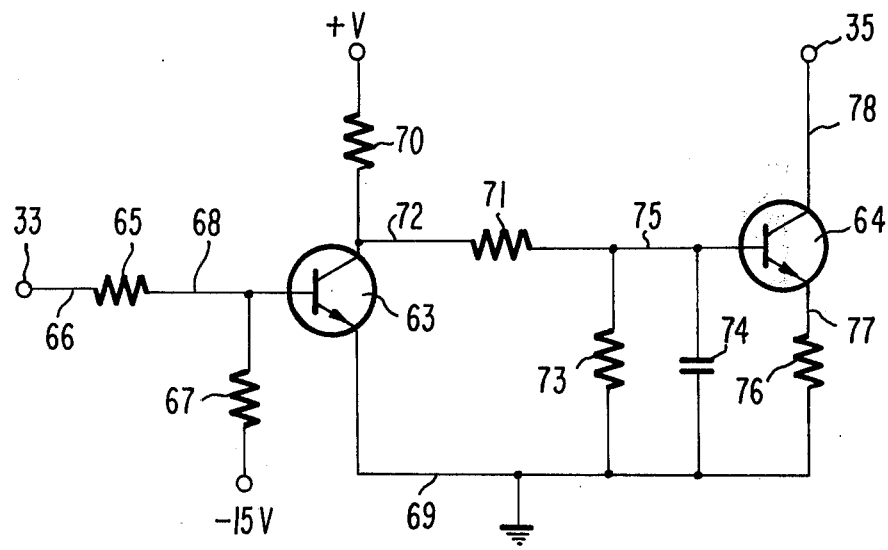
FIG. 6 is a schematic diagram of an inverting relay driver.

The inverting relay drivers 34 and 44 are identical to each other. By way of example, driver 34 is shown in FIG. 6 to comprise a first and a second transistor 63 and 64, respectively, such as a type 2N3440 having collector, base and emitter electrodes. The control terminal 33 is connected to one side of a 10 K ohm resistor 65 by a conductive path 66. The other side of the resistor 65 is connected to the base electrode of the first transistor 63 and one side of a 100 K ohm resistor 67 by a branching conductive path 68. The other side of the resistor 67 is connected to a 15V power supply (not shown). The emitter electrode of the first transistor 63 is connected to ground by one branch of a branching conductive path 69. The collector electrode of the first transistor 63 is connected to one side of a 5.1 K ohm resistor 70 and one side of a 1 K ohm resistor 71 by a branching conductive path 72. The other side of a 5.1 K ohm resistor 70 is electrically connected to a positive voltage source +V.

The other side of the 1 K ohm resistor 71 is connected to one side of a 2 K ohm resistor 73, one side of a 10 microfarad capacitor 74, and the base electrode of the second transistor 64 by a branching conductive path 75. The other side of the 2 K ohm resistor 73 and the other side of the capacitor 74 are connected to ground by branches of the branching conductive path 69. The emitter electrode of the second transistor 64 is connected to one side of a 10 ohm resistor 76 by a conductive path 77. The other side of the resistor 76 is connected to ground by a branch of the branching conductive path 69. The collector electrode is connected to the input terminal 35 by a conductive path 78.

Upon receipt, at the control terminal 33, of a voltage greater than voltage $V_c$, the first transistor 63 will turn on causing a voltage of less than approximately 1 volt to appear at the base of the second transistor 64 which prevents the second transistor from turning on. Since the second transistor 64 remains off, there is no completed circuit for the coil of the associated relay. If the voltage at the control terminal 33 is less than $V_c$, the first transistor 63 turns off which causes a positive voltage, greater than approximately 1 volt, to appear at the base of the second transistor 64. This positive base voltage causes the second transistor 64 to turn on which in turn completes the associated relay coil circuit, thereby energizing the relay.

Referring again to FIG. 5, an output of a 115 volt 60 Hz power supply 82 is electrically connected to a second side of the normally closed contacts 84(a) and normally open contacts 84(b) of the two pole reset switch 84, the relay power supply 54 and one terminal of the other pole of the double pole start switch 16 by a branching conductive path 86. The other terminal of the other pole of the start switch 16 is electrically connected to an input of the first time relay 36 through one pole of a third double pole time delay relay 88; an input of the third time delay relay 88; an input of a fourth double pole time delay relay 90 through the other pole of the first time delay relay 36; and, an input of the second time delay relay 46 through one pole of the fourth time delay relay 90 by a branching conductive path 92.

The first side of the normally closed contact (84(a) of the reset switch 84 is connected to the reset input of the first 36, second 46, third 88 and fourth 90 time delay relays by means of the branching conductive path 94. The first side of the normally open contact 84(b) is connected to the reset coils of the first and second latching relays 55 and 57, respectively, by a branching conductive path 81. The time delay relays are, for example, Magnacraft Corporation "Solid State Time Delay Relay" Catalog No. W211ACPSOX-5.

The control terminal of the first sample and hold means 20 is connected to ground through the other pole of the third time delay relay 88 by a conductive path 96. The control terminal of the second sample and hold means 24 is electrically connected to ground through the other pole of the fourth time delay relay 90 by a conductive path 98. The programming terminals of the programmable constant current source 12 are electrically interconnected through the switch contacts of the current control relay 60. When the switch contacts are in the position referred to as 100, the current source 12 will output the lower value quick heat current. When the switch contacts are in the position referred to a 102, the current source will ouput the higher value standard current.

The operation of the quick heat filament detector 10 is as follows. The third time delay relay 88 is adjusted for a delay of 0.5 second. The delay of the first time delay relay 36 is adjusted for 2.5 seconds. The delay of the fourth time delay relay 90 is adjusted for 0.5 second. The delay of the second time delay relay 46 is adjusted for 2.5 seconds.

Activating the start switch 16 simultaneously causes power to be applied to the third time delay relay 88 and the quick heat current to be applied to the filament under test 14 which in turn causes the filament voltage waveform (see FIGS. 2, 3 and 4) to appear at the inputs of the first and second sample and hold means 20 and 24 as well as one input of each of the first and second differential amplifiers, 22 and 26.

One-half second after the start switch 16 has been activated, the double pole switch of the third time delay relay 88 closes causing power to be applied to the first time delay relay 36 and causing the control terminal of the first sample and hold means 20 to be grounded. Consequently, the first time delay relay 36 begins to time out and the first sample and hold means 20 holds whatever filament voltage was present at one-half second after start. The voltage appearing at the output of the first differential amplifier 22 is now a function of the difference between the real time filament voltage and the filament voltage which was present one-half second after start.

Three seconds after start, the double pole switch of the first time delay relay 36 closes, causing power to be applied to the fourth time delay relay 90 which begins timing out and causing the voltage appearing at the output of the first differential amplifier 22 to be applied to the control terminal 33 of the first inverting relay driver 34. As previously described, if the applied voltage is less than $V_c$, indicating a standard filament, the first inverting relay driver 34 will complete the circuit of the coil of the first relay 40 causing the switch associated therewith to close. This causes power to be applied to the latch coil of the first latching relay 55 resulting in the closure of the associated switch. If the voltage exceeds $V_c$, the switch of the first relay 40 will remain open.

Three and one-half seconds after start, the double pole switch of the fourth time delay relay 90 closes, causing power to be applied to the second time delay relay 46 and causing the control terminal of the second sample and hold means 24 to be grounded. Consequently, the second time delay relay 46 begins to time out and the second sample and hold means 24 hold whatever filament voltage was present three and one-half seconds after start. The voltage appearing at the output of the second differential amplifier 26 is now a function of the difference between the real time filament voltage and the filament voltage which was present three and one-half seconds after start. 6 seconds after start, the double pole switch of the second time delay relay 46 closes causing the voltage appearing at the output of the second differential amplifier 26 to be applied to the control terminal 43 of the second inverting relay driver 44. If the applied voltage is less than $V_c$, indicating a standard filament, the second inverting relay driver 44 will complete this circuit of the coil of the second relay 50 causing the switch associated therewith to close. This causes the application of power to the latching coil of the second latching relay 57 which results in the closure of the associated switch. If the voltage exceeds $V_c$, the switch of the second relay 50 will remain open.

If the switches associated with both the first latching relay 55 and the second latching relay 57 have closed, an event which occurs only if a standard filament voltage waveform has been sensed twice, an operating voltage is applied to the current control relay 60. This causes the switch contacts of the relay 60 to move to the position referred to as 102. With the contacts in this position, the constant current source 12 will output the higher standard current. Thus, it is seen that the higher standard current will be applied only if both pairs of waveform measurements indicate a standard filament. The contacts 84(b) of the reset switch 84 are closed before testing another tube in order to initialize the time delay relays and the latching relays.

It is evident from the foregoing detailed description that the method of the present invention removes the current level decision making from the operator and permits the decision to be made automatically based upon the actual voltage waveform appearing across the filament terminals. Consequently, neither mismarking of a tube, misreading of a correctly marked tube, nor operator inattentiveness will result in a ruined tube due to the misapplication of filament current.

In addition, it has been determined that although the contact resistance of electrical connections may change significantly with respect to the value of differences in heater resistances, the slope of the waveforms do not change. Consequently, by the use of the method of the present invention, an accurate determination of heater types, using nominal resistance value as the identification parameter, can be made in spite of contact resistances which may vary from connector to connector and which are large enough to mask the difference in nominal resistance values.

I claim:
1. A method of detecting a nominal resistance value of a heater element in an electron tube, independent of measurement connection contact resistance, wherein said heater element has a resistance the value of which is equal to one of at least two nominal values, said method comprising the steps of:
  a. applying, at a first time, a first level of constant current through said heater;
  b. measuring, at a second time, a first voltage across said heater, said second time following said first time by a predetermined interval;
  c. measuring, at a third time, a second voltage across said heater and determining the difference between said first and said second voltage measurements, said third time following said second time by a predetermined interval; and d. comparing the value of the difference between said first and said second voltage measurements with a predetermined reference value.

2. A method in accordance with claim 1 comprising the additional steps of:

e. providing a first signal if the difference between said first and second voltage measurements is less than said reference value;

f. measuring, at a fourth time, a third voltage across said heater, said fourth time following said third time by a predetermined interval;

g. measuring, at a fifth time, a fourth voltage across said heater and determining the difference between said third and fourth voltage measurements, said fifth time following said fourth time by a predetermined interval;

h. comparing the value of the difference between said third and fourth voltage measurements with a second predetermined reference value and providing a second signal if said difference is less than said second reference value; and j. increasing said constant current to a second level upon occurrence of both the first and second signals.

3. A method in accordance with claim 2 wherein step (b) comprises providing sample and hold means for sampling the voltage across the heater 0.5 second after said first time and holding, at an output thereof, a voltage which is proportional to said sampled heater voltage.

4. A method in accordance with claim 3 wherein step (c) comprises providing a differential amplifier having an output voltage which is proportional to the difference between the voltage appearing across the heater 2.5 seconds after said second time and the voltage being held at the output of said sample and hold means.

5. A method in accordance with claim 4 wherein step (e) comprises providing sample and hold means for sampling the voltage appearing across the heater 0.5 second after said third time and holding, at an output thereof, a voltage which is proportional to said sampled heater voltage.

6. A method in accordance with claim 5 wherein step (f) comprises providing a differential amplifier having an output voltage which is proportional to the difference between the voltage appearing across the heater 2.5 seconds after said fourth time and the voltage being held at the output of said sample and hold means.

* * * * *